(12) United States Patent
Zhu et al.

(10) Patent No.: US 8,673,701 B2
(45) Date of Patent: Mar. 18, 2014

(54) SEMICONDUCTOR STRUCTURE AND METHOD FOR MANUFACTURING THE SAME

(75) Inventors: Huilong Zhu, Poughkeepsie, NY (US); Qingqing Liang, Lagrangeville, NY (US); Zhijiong Luo, Poughkeepsie, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/376,247

(22) PCT Filed: Aug. 2, 2011

(86) PCT No.: PCT/CN2011/077908
§ 371 (c)(1),
(2), (4) Date: Dec. 9, 2011

(87) PCT Pub. No.: WO2012/174770
PCT Pub. Date: Dec. 27, 2012

(65) Prior Publication Data
US 2012/0326155 A1    Dec. 27, 2012

(30) Foreign Application Priority Data
Jun. 24, 2011    (CN) .......................... 2011 1 0173892

(51) Int. Cl.
*H01L 21/84* (2006.01)
(52) U.S. Cl.
USPC .................... 438/157; 257/347; 257/E21.623
(58) Field of Classification Search
USPC .......... 257/347, 350, 366, E21.623; 438/157, 438/176, 195
See application file for complete search history.

(56) References Cited

U.S. PATENT DOCUMENTS

| 6,072,217 A | 6/2000 | Burr |
| 8,030,145 B2 * | 10/2011 | Chang et al. .................. 438/157 |
| 2010/0187643 A1 | 7/2010 | Chudzik et al. |

FOREIGN PATENT DOCUMENTS

| CN | 1487597 A | 4/2004 |
| CN | 1901228 A | 1/2007 |

OTHER PUBLICATIONS

International Search Report and Written Opinion for PCT Application No. PCT/CN2011/077908, dated Mar. 29, 2012, 13 pages.

*Primary Examiner* — Quoc Hoang
(74) *Attorney, Agent, or Firm* — Westman, Champlin & Koehler, P.A.

(57) ABSTRACT

The present application discloses a semiconductor structure and method for manufacturing the same. The semiconductor structure comprises: an SOI substrate and a MOSFET formed on the SOI substrate, wherein the SOI substrate comprises, in a top-down fashion, an SOI layer, a first buried insulator layer, a buried semiconductor layer, a second buried insulator layer, and a semiconductor substrate, the buried semiconductor layer including a backgate region including a portion of the buried semiconductor layer doped with a dopant of a first polarity; the MOSFET comprises a gate stack and source/drain regions, the gate stack being formed on the SOI layer, and the source/drain regions being formed in the SOI layer at opposite sides of the gate stack; and the backgate region includes a counter-doped region, the counter-doped region is self-aligned with the gate stack and includes a dopant of a second polarity, and the second polarity is opposite to the first polarity. The embodiment of the present disclosure can be used for adjusting a threshold voltage of a MOSFET.

14 Claims, 3 Drawing Sheets

SEMICONDUCTOR STRUCTURE AND METHOD FOR MANUFACTURING THE SAME

CROSS-REFERENCE TO RELATED APPLICATION(S)

This application is a National Phase application of and claims priority to No. PCT/CN2011/077908, filed on Aug. 2, 2011, entitled "SEMICONDUCTOR STRUCTURE AND METHOD FOR MANUFACTURING THE SAME", which claims priority to the Chinese Patent Application No. 201110173892. 1, filed on Jun. 24, 2011, which are incorporated herein by reference in their entirety.

TECHNICAL FIELD

The present disclosure relates to semiconductor manufacturing technology, and more particularly, to semiconductor structures formed in an ultrathin Semiconductor on Insulator (SOI) and methods for manufacturing the same.

BACKGROUND

As a dimension of a semiconductor device becomes smaller continuously, a key size of the semiconductor device, i.e. a gate length, becomes shorter continuously. When the gate length of a metal oxide semiconductor field effect transistor (MOSFET) decreases to below 45 nm, the MOSFET exhibits more significant short channel effects (SCE). The short channel effects include threshold voltage drift, lower carrier mobility, Drain Induced Barrier Lowering (DIBL), and other effects of the semiconductor device.

One known approach for suppressing the short channel effects introduces an additional semiconductor layer between a semiconductor substrate and an SOI structure. The additional semiconductor layer is ion doped to form a backgate structure, to which a bias voltage is applied so as to adjust the threshold voltage of the semiconductor device. However, in such an approach, different bias voltages are applied to backgates of pMOSFETs and nMOSFETs so as to adjust the threshold voltages in different manners, which means that different backgate contacts should be provided for the pMOSFETs and the nMOSFETs. Consequently, the backgate contacts occupy an increased footprint, which hinders further improvement of the integration level of a semiconductor device.

In view of this, it is still desirable for novel semiconductor structures and methods for manufacturing the same, such that the threshold voltages of the pMOSFET and the nMOSFET can be adjusted respectively and the integration level can be improved.

SUMMARY OF THE DISCLOSURE

The object of the present disclosure is to provide semiconductor structures and methods for manufacturing the same, to overcome the foregoing problems in the prior art, such that the threshold voltages of the pMOSFET and the nMOSFET can be adjusted respectively and the integration level can be improved.

According to one aspect of the present disclosure, there is provided a semiconductor structure comprising: an SOI substrate and a MOSFET formed on the SOI substrate, wherein the SOI substrate comprises, in a top-down fashion, an SOI layer, a first buried insulator layer, a buried semiconductor layer, a second buried insulator layer, and a semiconductor substrate, the buried semiconductor layer including a backgate region including a portion of the buried semiconductor layer doped with a dopant of a first polarity; the MOSFET comprises a gate stack and source/drain regions, the gate stack being formed on the SOI layer, and the source/drain regions being formed in the SOI layer at opposite sides of the gate stack; and the backgate region includes a counter-doped region, the counter-doped region is self-aligned with the gate stack and includes a dopant of a second polarity, and the second polarity is opposite to the first polarity.

According to another aspect of the present disclosure, there is provided a method for manufacturing a semiconductor structure, comprising: providing an SOI substrate, the SOI substrate including, in a top-down fashion, an SOI layer, a first buried insulator layer, a semiconductor buried layer, a second buried insulator layer, and semiconductor substrate; implanting a dopant of a first polarity into the buried semiconductor layer to form a backgate region; forming a MOSFET on the SOI layer, the MOSFET including a sacrificial gate and source/drain regions, wherein the sacrificial gate is formed on the SOI layer and is surrounded by a spacer, the source/drain regions are formed in the SOI layer at opposite sides of the sacrificial gate; removing the sacrificial gate to form an opening inside the spacer; implanting a dopant of a second polarity from the opening to form a counter-doped region in the backgate region in such a manner that the counter-doped region is self-aligned with the opening, wherein the second polarity is opposite to the first polarity; and forming a replacement gate stack in the opening.

According to the embodiments of the semiconductor structure and method for manufacturing the same of the present disclosure, the counter-doped region is formed in the backgate structure formed in the buried semiconductor layer in such a manner that the counter-doped region is self-aligned with the gate electrode. The threshold voltages of different MOSFETs can be adjusted by the backgate. In the case that both the pMOSFET and the nMOSFET are formed in one semiconductor structure, the threshold voltages of different semiconductor devices can be varied by the counter-doped region. Thus, the threshold voltages of the pMOSFET and nMOSFET can be adjusted respectively by one backgate contact, which greatly improves the integration level of the semiconductor device.

BRIEF DESCRIPTION OF THE DRAWINGS

The above and other objects, features and advantages of the present disclosure will become clearer from the following description for preferred embodiments of the present disclosure, with reference to the attached drawings, in which.

DETAILED DESCRIPTION

Exemplary embodiments of the present disclosure will be described in more details below with reference to the accompanying drawings. However, it should be understood that the description of the embodiments of the present disclosure is illustrative and is not intended to limit the scope of the disclosure. In addition, those well known structures and technology are omitted thereinafter, for the sake of avoiding unnecessary confusion to the conception of the present disclosure.

Layered structures according to the embodiments of the present disclosure are schematically shown in the accompanying drawings. The figures are provided only for illustration and not drawn to scale, in which some details are exaggerated, and some other details are probably omitted, for the sake of clarity. Shapes, relative sizes and relative positions of various regions and layers shown in the figures are only illustrative, and can be varied actually because of manufacturing tolerance or technical limitation. Those skilled in the art may design other shapes, relative sizes and relative positions of the various regions/layers if necessary.

FIGS. 1-9 show cross-sectional view of structures corresponding to various stages in flow of manufacturing the semiconductor structure according to embodiments of the present disclosure. Detailed description will be made for each stage according to an embodiment of the present disclosure and the resultant semiconductor structure with reference to these accompanying drawing.

Figure 1:
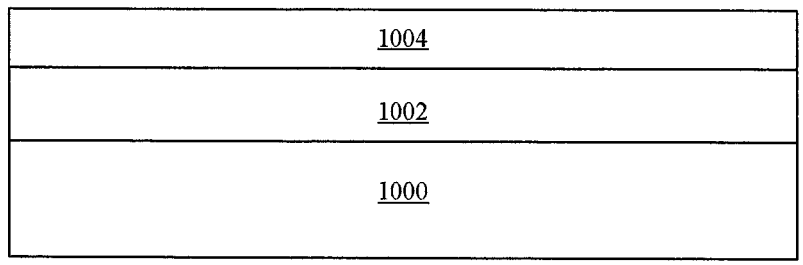
FIG. 1-10 show cross-sectional views for illustrating structures corresponding to various stages of the flow of manufacturing a semiconductor structure according to an embodiment of the present disclosure.

First of all, as shown in FIG. 1, a stacked tri-layer structure is formed. Specifically, a conventional semiconductor substrate 1000 is first provided. A second buried insulator layer 1002 is formed on the semiconductor substrate 1000, such as a buried oxide layer formed by deposition. Next, a buried semiconductor layer 1004 may be formed on the second buried insulator layer 1002, such as a polysilicon layer formed by deposition. In this way, a stacked tri-layer structure comprising a buried semiconductor layer 1004, a second buried insulator layer 1002 and a semiconductor substrate 1000 is formed.

According to the embodiments of the present disclosure, the semiconductor substrate 1000 may comprise any suitable semiconductor substrate materials. Specifically, the semiconductor substrate 1000 is made of but not limit to silicon, germanium, silicon germanium, SOI, silicon carbide, gallium arsenide, or any of semiconductor of III-V group compounds. According to the design requirement (such as a p-type substrate or an n-type substrate) well known in the prior art, the substrate 1000 may comprise various doped regions. In addition, the substrate 1000 may optionally comprise epitaxial layers which can have enhanced performance by stress. The buried semiconductor layer can also be single crystal silicon. The method for forming the buried semiconductor layer 1004 may comprise bonding one layer of SOI structure on the second buried insulator layer 1002.

Figure 2:
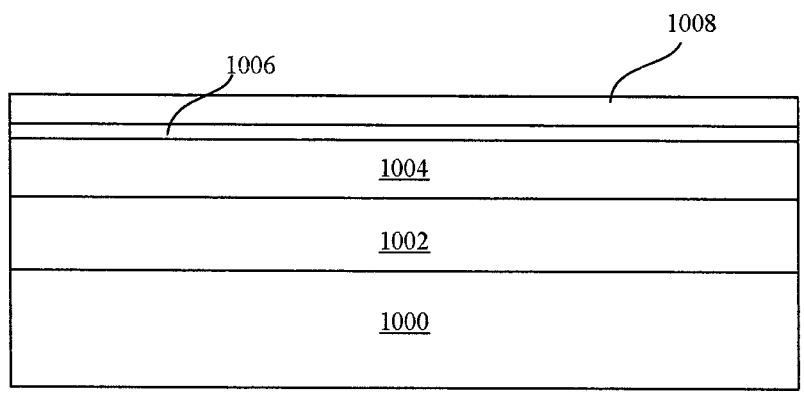
Figure 3:
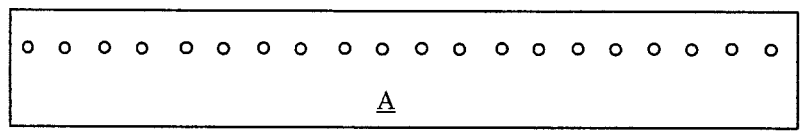

Then, as shown in FIG. 2, a first buried insulator layer 1006 and an SOI layer 1008 are formed on the stacked tri-layer structure. The method for forming the SOI layer 1008 on the structure shown in FIG. 1 may rely on any known techniques. For example, the SmartCut™ process (referred as "Smart Cut" or "Smart Strip") can be used for this purpose. The SmartCut™ process comprises the steps of: as shown in FIG. 3, providing a silicon wafer A; implanting a certain dose of hydrogen ions into the silicon wafer A; bonding the surface of this silicon wafer A into which hydrogen ions have been implanted with the top surface of the stacked tri-layer structure shown in FIG. 1 by bonding technology; in a subsequent heat treatment process, a micro-cavity layer is formed at an implantation depth of the hydrogen ions in the silicon wafer A, and an SOI layer is formed at a surface of the silicon wafer; furthermore, the above-mentioned SOI layer is stripped at an implantation depth of the hydrogen ions and transferred to the surface of the stacked tri-layer structure shown in FIG. 1, such that the SOI substrate shown in FIG. 2 can be obtained. The thickness of the SOI layer 1008 may be controlled by the energy of hydrogen implantation. This process is not related to the spirit of the present disclosure, and the specific steps and parameters can be found in the prior art. The process of forming the buried semiconductor layer 1004 is also included in the SmartCut™ process.

In this way, the SOI substrate shown in FIG. 2 is formed, which comprises, in a top-down fashion, an SOI layer 1008, a first buried insulator layer 1006, a buried semiconductor layer 1004, a second buried insulator layer 1002 and a semiconductor substrate.

Figure 4:
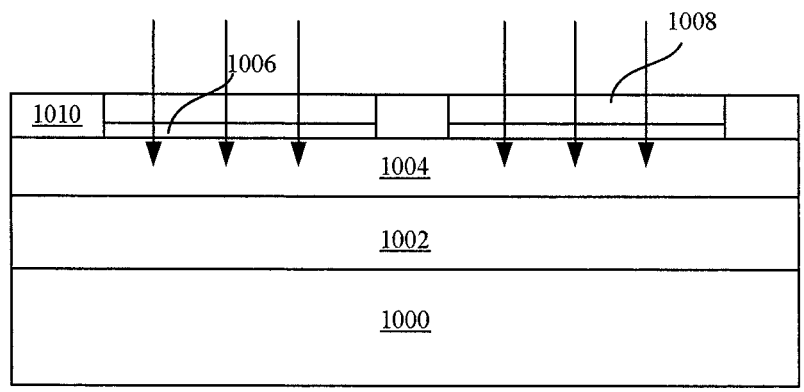

Next, as shown in FIG. 4, ions are implanted into the buried semiconductor layer 1004 to form a backgate region. In the first ion implantation, a dopant of a first polarity is implanted.

Specifically, the type of dopants and the doping profile in the ion implantation process depend on the type of the MOSFET and the target value of the threshold voltage. In order to increase a threshold voltage of a semiconductor device, for an nMOSFET, p-type dopants may be used, such as boron (B or $BF_2$), indium (In), or their combinations; and for a pMOSFET, n-type dopants may be used, such as arsenic (As), phosphorus (P), or their combinations. In order to decrease the threshold voltage, for an nMOSFET, n-type dopants may be used, such as arsenic (As), phosphorus (P), or their combinations; and for a pMOSFET, p-type dopants may be used, such as boron (B or $BF_2$), indium (In), or their combinations.

After ion implantation, an STI structure 1010 can be formed by a conventional process. Detailed description is omitted for this.

The implanted dopant can have a doping concentration dependent on a thickness of the buried semiconductor layer 1004, for example in the range of about $10^{17}$-$10^{20}$ $cm^{-3}$, such as $10^{17}$ $cm^{-3}$, $10^{18}$ $cm^{-3}$, $10^{19}$ $cm^{-3}$, and $10^{20}$ $cm^{-3}$.

Figure 5:
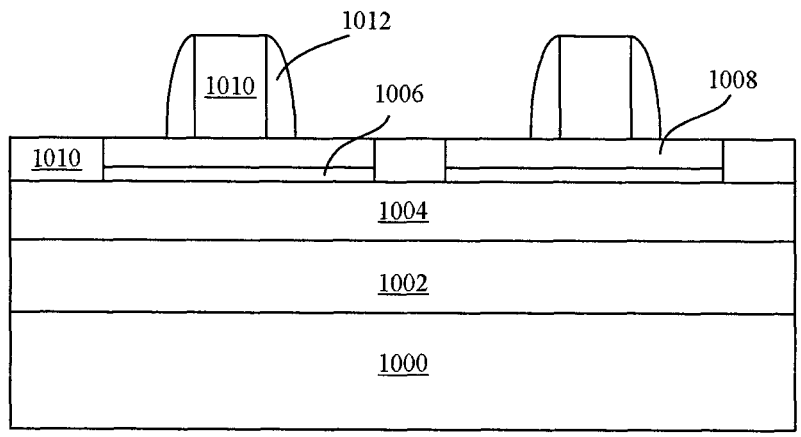
Figure 6:
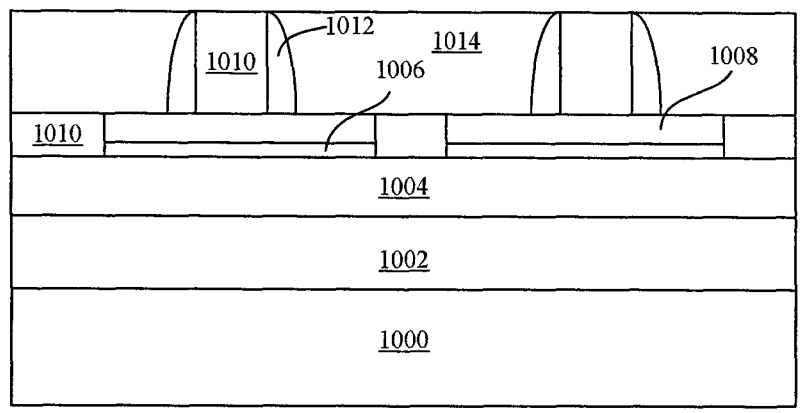

Then, as shown in FIG. 5, a standard CMOS process can be performed, comprising: forming a sacrificial gate 1010, forming a spacer 1012 surrounding the sacrificial gate 1010, performing source/drain implantation to forming a source region and a drain region (not shown) in the SOI layer 1008, forming an interlayer dielectric layer 1014 on the whole semiconductor structure, and performing planarization on the interlayer dielectric layer 1014 until the sacrificial gate 1010 is exposed. According to the embodiment of the present disclosure, the sacrificial gate 1010 may be preferably a polysilicon gate.

Figure 7:
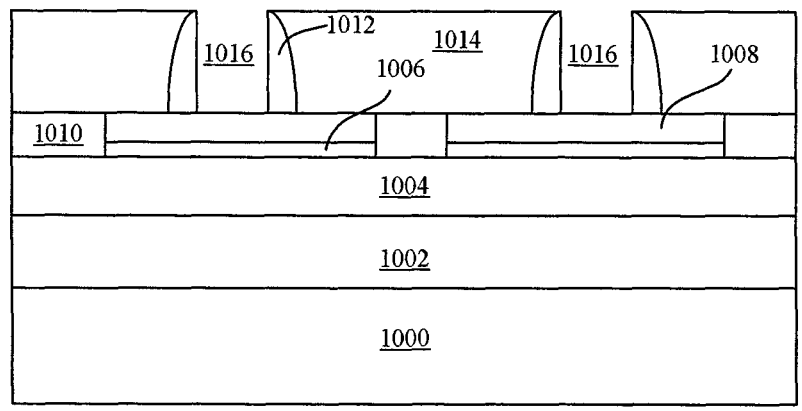

Next, a replacement gate process is performed. As shown in FIG. 7, the sacrificial gate 1010 is removed by a conventional process to form an opening 1016 inside the spacer 1012. For example, reactive ion etching can be used to remove the polysilicon gate.

Figure 8:
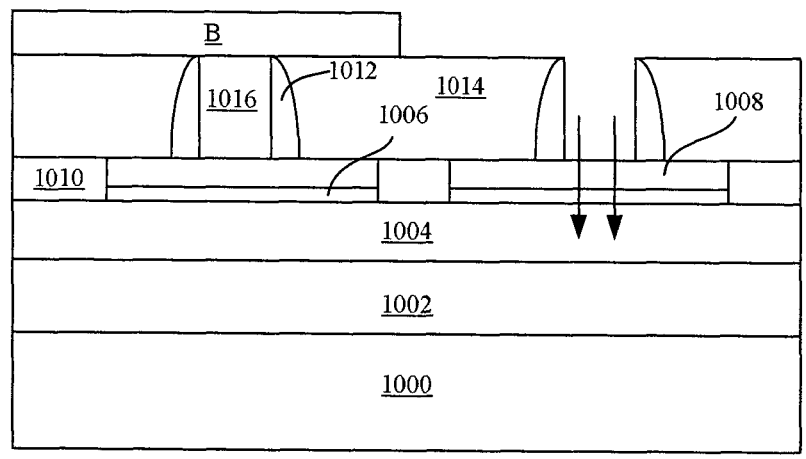

As shown in FIG. 8, a left side MOSFET is covered with a photoresist B. Dopant implantation is performed through a right side opening 1016, with a dopant of a second polarity. The second polarity is opposite to the first polarity used in the implanting of FIG. 4. For example, if an n-type dopant is implanted in FIG. 4, a p-type dopant is implanted herein. The dopant of the second polarity may have an doping concentration of about $10^{17}$-$10^{20}$ $cm^{-3}$, such as $10^{17}$, $10^{18}$, $10^{19}$, and $10^{20}$.

Figure 9:
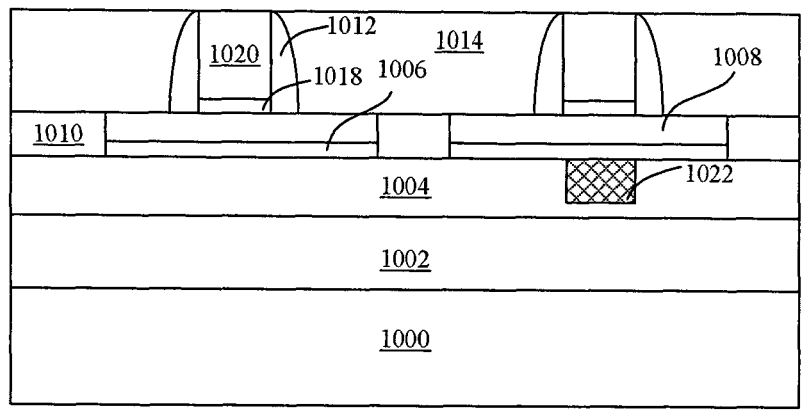

As shown in FIG. 9, rapid annealing is performed to activate the first dopant and the second dopant, such that a counter-doped region 1022 is formed. In this step, the rapid annealing may be preferably performed at a temperature of about 800-1200° C. The counter-doped region 1022 can adjust a threshold voltage of a pMOSFET or an nMOSFET.

An example with more details is given here for explaining the principle of the present disclosure. An nMOSFET is disposed at the left side and a pMOSFET is disposed at the right side. In the first ion implantation a p-type dopant is implanted, a threshold voltage of the nMOSFET is increased, but a threshold voltage of the pMOSFET is decreased. In order to increase the threshold voltage of the pMOSFET, an n-type dopant is implanted in the second ion implantation. In this way, the object of simultaneously adjusting the threshold voltages of a plurality of MOSFETs using one backgate voltage can be achieved, Next, as shown in FIG. 9, the photoresist B is removed and a replacement gate stack is formed. Specifically, a gate dielectric layer 1018 is first formed in the opening, for example, with a high dielectric constant (high-K) gate dielectric material. The high-K gate dielectric layer may comprises one or more selected from a group consisting of $HfO_2$, HfSiO, HfSiON, HfTaO, HfTiO, HfZrO, $Al_2O_3$, $La_2O_3$, $ZrO_2$, and LaAlO. For example, the high-K gate dielectric layer is $HfO_2$ formed by deposition with a thickness of about 2-4 nm. Then a metal layer 1020 is formed on the gate dielectric layer 1018. The metal layer 1020 can is capable of adjusting a threshold voltage of the MOSFET. In a pMOSFET, the metal layer 1020 may comprises one or more selected from a group consisting of MoNx, TiSiN, TiCN, TaAlC, TiAlN, TaN, PtSix, $Ni_3Si$, Pt, Ru, Ir, Mo, HfRu and RuOx. In an nMOSFET, the metal layer may comprise one or more selected from a group consisting of TaC, TiN, TaTbN, TaErN, TaYbN, TaSiN, HfSiN, MoSiN, RuTax and NiTax. The above metals have different work function and can be appropriately used for a metal layer to provide the desired threshold voltage of the semiconductor device.

Figure 10:
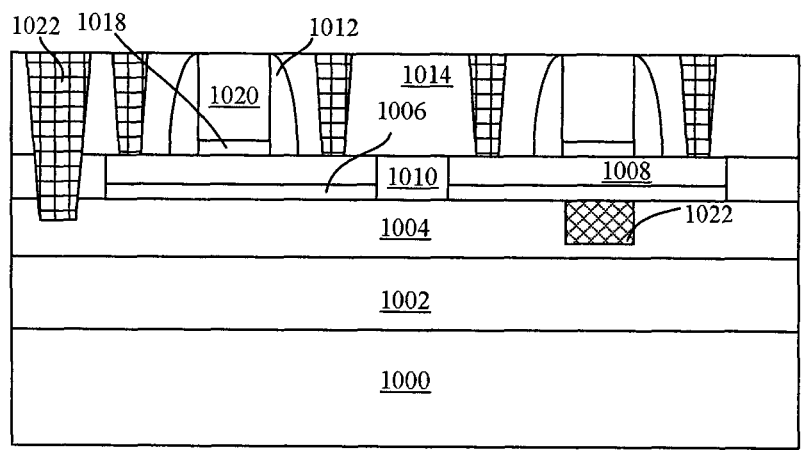

Finally, contacts 1022 are formed on the whole semiconductor structure, including source/drain contacts, a gate electrode contact and a backgate contact. As shown in FIG. 10, even in the case that both an nMOSFET and a pMOSFET are formed in a semiconductor substrate, only one backgate contact is needed. When a backgate voltage is applied to the nMOSFET and pMOSFET, the threshold voltages of the nMOSFET and the pMOSFET can be adjusted in different manners.

Shown in FIG. 10 is a cross-sectional view of the semiconductor structure according to one embodiment of the present disclosure. The semiconductor structure comprises an SOI substrate and MOSFETs formed in the SOI substrate.

The SOI substrate comprises, in a top-down fashion, an SOI layer 1008, a first buried insulator layer 1006, a buried semiconductor layer 1004, a second buried insulator layer 1002 and a semiconductor substrate 1000. The buried semiconductor layer 1004 includes a backgate region which is formed by doping the buried semiconductor layer 1004 with a dopant of a first polarity.

The MOSFET comprises a gate stack and source/drain regions, wherein the gate stack is located on the SOI layer 1008, and the source/drain regions are formed in the SOI layer at opposite sides of the gate stack (not shown in figures).

Preferably, the backgate region may include a counter-doped region 1022 which is located beneath the gate stack. The counter-doped region 1022 includes a dopant of a second polarity. The second polarity is opposite to the first polarity.

Preferably, the buried semiconductor layer may be made of polysilicon or single crystal silicon.

Preferably, the gate stack comprises a high-K gate dielectric layer 1018 and a metal layer 1020. The high-K gate dielectric layer may comprise one or more selected from a group consisting of $HfO_2$, HfSiO, HfSiON, HfTaO, HfTiO, HfZrO, $Al_2O_3$, $La_2O_3$, $ZrO_2$, and LaAlO. The metal layer metal layer is capable of adjusting the threshold voltage of the MOSFET. In a pMOSFET, the metal layer may comprise one or more selected from a group consisting of MoNx, TiSiN, TiCN, TaAlC, TiAlN, TaN, PtSix, $Ni_3Si$, Pt, Ru, Ir, Mo, HfRu and RuOx. In an nMOSFET, the metal layer may comprise one or more selected from a group consisting of TaC, TiN, TaTbN, TaErN, TaYbN, TaSiN, HfSiN, MoSiN, RuTax and NiTax.

Preferably, the dopant of a first polarity in the backgate region has a doping concentration of about $10^{17}$-$10^{20}$ $cm^{-3}$, for example, $10^{17}$, $10^{18}$, $10^{19}$ or $10^{20}$.

The dopant of the second polarity in the counter-doped region has a doping concentration of about $10^{17}$-$10^{20}$ $cm^{-3}$, for example, is $10^{17}$, $10^{18}$, $10^{19}$ or $10^{20}$.

As shown in FIG. 10, even in the case that both an nMOSFET and a pMOSFET are formed in the semiconductor substrate, only one backgate contact is needed, because a counter-doped region is incorporated in a backgate region of one of the nMOSFET and the pMOSFET. When a backgate voltage is applied to the nMOSFET and pMOSFET, the threshold voltages of the nMOSFET and the pMOSFET can be adjusted in different manners. The present disclosure improves the integration level of the semiconductor device. In the above description, the technical details such as patterning, etching for each layer are not explained. However, it can be understood by those skilled in the art that various approaches known in the prior art can be used to form the layers and regions having the desired shapes. Moreover, those skilled in the art can develop the approaches which are a little different from the above approaches to form the same structure.

The disclosure has been described with reference to specific embodiments. However, the description is only illustrative of the disclosure, and is not construed as limiting the scope of the disclosure. The scope of the present disclosure is defined by the appended claims and equivalents thereof. Various modifications and substitutions may occur for those skilled in the art without departing from the true spirit and scope of the disclosure.

We claim:

1. A semiconductor structure comprising:
    an SOI substrate and a MOSFET formed on the SOI substrate, wherein
    the SOI substrate comprises, in a top-down fashion, an SOI layer, a first buried insulator layer, a buried semiconductor layer, a second buried insulator layer, and a semiconductor substrate, the buried semiconductor layer including a backgate region including a portion of the buried semiconductor layer doped with a dopant of a first polarity;
    the MOSFET comprises a gate stack and source/drain regions, the gate stack being formed on the SOI layer, and the source/drain regions being formed in the SOI layer at opposite sides of the gate stack; and
    the backgate region includes a counter-doped region, the counter-doped region is self-aligned with the gate stack and includes a dopant of a second polarity, and the second polarity is opposite to the first polarity.

2. The semiconductor structure according to claim 1, wherein the buried semiconductor layer is made of polysilicon or single crystal silicon.

3. The semiconductor structure according to claim 1, wherein the gate stack comprises a high-K gate dielectric layer and a metal layer, and the metal layer is capable of adjusting the threshold voltage of the MOSFET.

4. The semiconductor structure according to claim 3, wherein
    the metal layer in a pMOSFET comprises one or more materials selected from a group consisting of MoNx, TiSiN, TiCN, TaA1C, TiA1N, TaN, PtSix, $Ni_3Si$, Pt, Ru, Ir, Mo, HfRu, and RuOx; and the metal layer in an nMOSFET comprises one or more materials selected from a group consisting of TaC, TiN, TaTbN, TaErN, TaYbN, TaSiN, HfSiN, MoSiN, RuTax, and NiTax.

5. The semiconductor structure according to claim 1, wherein the dopant of a first polarity in the backgate region has a doping concentration of about $10^{17}$-$10^{20}$ cm$^{-3}$.

6. The semiconductor structure according to claim 1, wherein the dopant of the second polarity in the counter-doped region has a doping concentration of about $10^{17}$-$10^{20}$ cm$^{-3}$.

7. A method for manufacturing a semiconductor structure, comprising:
provided an SOI substrate, the SOI substrate including, in a top-down fashion, an SOI layer, a first buried insulator layer, a semiconductor buried layer, a second buried insulator layer, and semiconductor substrate;
implanting a dopant of a first polarity into the buried semiconductor layer to form a backgate region;
forming a MOSFET on the SOI layer, the MOSFET including a sacrificial gate and source/drain regions, wherein the sacrificial gate is formed on the SOI layer and is surrounded by a spacer, the source/drain regions are formed in the SOI layer at opposite sides of the sacrificial gate;
removing the sacrificial gate to form an opening inside the spacer;
implanting a dopant of a second polarity from the opening to form a counter-doped region in the backgate region in such a manner that the counter-doped region is self-aligned with the opening, wherein the second polarity is opposite to the first polarity; and
forming a replacement gate stack in the opening.

8. The method according to claim 7, wherein the buried semiconductor layer is made of polysilicon or single crystal silicon.

9. The method according to claim 7, wherein after the step of implanting the dopant of the second polarity from the opening, further comprises:
performing annealing to activate the dopant of the first polarity and the dopant of the second polarity.

10. The method according to claim 9, wherein the annealing is performed at a temperature of about 800-1200° C.

11. The method according to claim 7, wherein the step of forming the replacement gate stack in the opening comprises:
forming a gate dielectric layer in the opening; and
forming a metal layer on the gate dielectric layer, wherein the metal layer is capable of adjusting the threshold voltage of the MOSFET.

12. The method according to claim 11,
the metal layer in a pMOSFET comprises one or more materials selected from a group consisting of MoNx, TiSiN, TiCN, TaAlC, TiAlN, TaN, PtSix, Ni$_3$Si, Pt, Ru, Ir, Mo, HfRu, and RuOx; and
the metal layer in an nMOSFET one or more materials selected from a group consisting of TaC, TiN, TaTbN, TaErN, TaYbN, TaSiN, HfSiN, MoSiN, RuTax, and NiTax.

13. The method according to claim 7, wherein the step of implanting the dopant of the first polarity into the buried semiconductor layer to form the backgate region comprises:
implanting the dopant of the first polarity, wherein the implanted dopant has a doping concentration of about $10^{17}$-$10^{20}$ cm$^{-3}$.

14. The method according to claim 7, wherein in the step of implanting the dopant of the second polarity from the opening, the implanted dopant has a doping concentration of about $10^{17}$-$10^{20}$ cm$^{-3}$.

* * * * *